United States Patent
Baumgartner et al.

(10) Patent No.: US 7,203,915 B2
(45) Date of Patent: Apr. 10, 2007

(54) METHOD FOR RETIMING IN THE PRESENCE OF VERIFICATION CONSTRAINTS

(75) Inventors: Jason Raymond Baumgartner, Austin, TX (US); Hari Mony, Austin, TX (US); Viresh Paruthi, Austin, TX (US); Jiazhao Xu, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 11/077,331

(22) Filed: Mar. 10, 2005

(65) Prior Publication Data

US 2006/0206842 A1 Sep. 14, 2006

(51) Int. Cl.
G06F 17/50 (2006.01)
(52) U.S. Cl. .................. 716/4; 716/1; 716/6; 716/18
(58) Field of Classification Search .................. 716/1, 716/2, 4, 6, 18
See application file for complete search history.

(56) References Cited

U.S. PATENT DOCUMENTS 6,216,252 B1 * 4/2001 Dangelo et al. ............... 716/1

OTHER PUBLICATIONS

Charles E. Leserson & James B. Saxe, "Retiming Synchronous Circuitry", Article, 1991, vol./Issue No. Unknown, Springer-Verlag New York Inc., USA.

Andreas Kuehlman & Jason Baumgartner, "Transformation-Based Verification Using Generalized Retiming", Article, 2001, vol./Issue Unknown, Springer-Verlag New York Inc., USA.

* cited by examiner

*Primary Examiner*—Thuan Do
(74) *Attorney, Agent, or Firm*—Casimer K. Salys; Dillon & Yudell LLP (57) ABSTRACT

A method, system and computer program product for performing retiming in the presence of constraints are disclosed. The method comprises receiving an initial design containing one or more targets and one or more constraints and enumerating the one or more constraints and the one or more targets into a retiming gate set. A retiming graph is constructed from the initial design, and a retiming solution is obtained on the retiming graph. The retiming solution is normalized. One or more retiming lags from the retiming graph are propagated to the initial design, and the initial design is verified by using a constraint-satisfying analysis to determine whether the one or more targets may be hit while the one or more constraints are satisfied.

20 Claims, 3 Drawing Sheets

METHOD FOR RETIMING IN THE PRESENCE OF VERIFICATION CONSTRAINTS

BACKGROUND OF THE INVENTION

1. Technical Field

The present invention relates in general to verifying designs and in particular to performing retiming analysis. Still more particularly, the present invention relates to a system, method and computer program product for performing retiming analysis in the presence of verification constraints.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process.

Among the available verification techniques, formal and semiformal verification techniques are powerful tools for the construction of correct logic designs. Formal and semiformal verification techniques offer the opportunity to expose some of the probabilistically uncommon scenarios that may result in a functional design failure, and frequently offer the opportunity to prove that the design is correct (i.e., that no failing scenario exists). Unfortunately, formal verification techniques require computational resources which are exponential with respect to the design under test. In particular, many formal analysis techniques require exponential resources with respect to the number of state elements in the design under test. Semi-formal verification techniques leverage formal algorithms on larger designs by applying them only in a resource-bounded manner, though at the expense of incomplete verification coverage. Generally, coverage decreases as design size increases.

Constraints are often used in verification to prune the possible input stimulus in certain states of the design. For example, a constraint may state "if the design's buffer is full, then constrain the input stimulus to prevent new transfers into the design". Semantically, the verification tool must discard any states for which a constraint evaluates to a 0 (i.e., the verification tool may never produce a failing scenario showing a violation of some property of the design, if that scenario does not adhere to all the constraints for all time-steps prior to the failure). In the previous example, it would be illegal for the verification tool to produce a trace of length "i" showing a violation of some property, if that trace illustrated the scenario that the buffer was full and a new transfer was initiated into the design between time 0 and i (inclusive).

Retiming techniques, initially developed for enhanced synthesis, have more recently been proposed to enhance verification through reduction in state element count. However, prior art retiming algorithms have the problematic propensity to shift every gate in a design under verification by an arbitrary amount, which poses challenges to the use of retiming in a verification setting under the presence of constraints. Specifically, a verification tool may lose the ability to discern whether a trace is "legal" (e.g., adhering to all constraints at all time-steps until the violation of a property), if the property gate and the constraint gate were retimed by different amounts before passing them into the verification tool. No prior art technique addresses how to enable such an application.

Figure 3A:
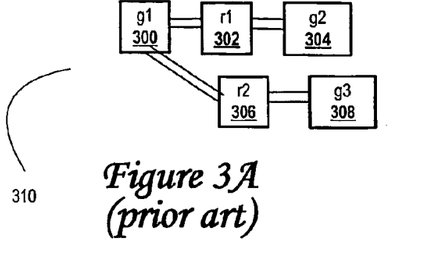
FIG. 3A illustrates an exemplary initial circuit design.

Generally speaking, retiming refers to the process of moving state elements across combinational gates. More specifically, a "retiming" of a circuit is a labeling of each of its combinational gates "g" with an integer "r(g)", where "r(g)" represents the number of state elements (hereafter referred to as "registers") that were dragged backward (i.e., toward the circuit inputs) across gate g. Referring now to FIG. 3A, an exemplary initial circuit design is depicted. Exemplary initial circuit design 310 has a primary input gate g1 300, which has two sinks: register r1 302, and register r2 306. Register r1 302 in turn has a buffer g2 304 as a sink, and register r2 306 has an inverter gate g3 308 as a sink.

A retiming may label g1 300 with 0, and g2 304 with −1, meaning that the retiming has relocated the register r1 302 "fanout-wise across" g2 304. Hereafter, a negative retiming, which relocates a register fanout-wise across a gate, is referred to as a "forward retiming". In a verification setting, it is often desirable to solve a retiming problem in such a way that the total number of state elements in the design is minimized. Various prior-art algorithms are available to solve the resulting minimization problem. For example, retiming may be cast as a min-cost flow problem for which the "network simplex" algorithm or an Integer Linear Program solver may be used to obtain a solution.

Retiming in the presence of constraints is a nontrivial problem, as illustrated by the following example. Returning to the example of FIG. 3A, assume g2 304 is a verification "target", meaning that an attempt is being made to demonstrate whether or not it is possible to drive a logical '1' to g2 304. With no constraints, the prior art, given the semantics of an appropriate netlist (discussed below), allows a verification tool to freely drive a 0 or a 1 value to the primary input gate g1 300. R1 302 will shadow the value on g1 300 one time-step later, while g2 304 always evaluates to the same value as r1 302. However, assuming that g3 308 is labeled as a constraint, meaning that the verification tool may never evaluate that gate to a "0", prior art methods limit the tool such that the tool cannot evaluate r2 306 to a "1". Because r1 302 and r2 306 always takes the same value, the target may never be asserted to a "1".

Figure 3B:
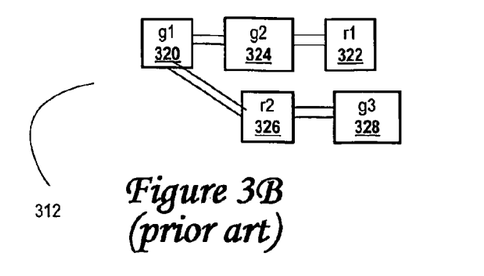
FIG. 3B illustrates an exemplary retimed circuit design.

Referring now to FIG. 3B, an exemplary retimed circuit design which has been retimed from initial circuit design 310 under prior-art techniques is depicted. Exemplary retimed circuit design 312 has a primary input gate g1 320 and still contains register r1 322, register r2 326, buffer g2 324 and an inverter gate g3 328. Retiming initial circuit design 310 relocates r1 322 fanout-wise past g2 324. Such a retiming will alter the semantics of the verification problem as g2 324 takes the same value as g1 320 (without a one time-step delay), and the constraint only "restricts" the behavior of g1 320 one time-step later. The example depicted in FIG. 3A and FIG. 3B demonstrates a key inadequacy of prior art retiming techniques; retiming may take a target which is not assertable appear to be assertable.

It is also noteworthy that the reverse transformation from FIG. 3B to FIG. 3A by relocating r1 322 fanin-wise across g2 324 may additionally make an assertable target appear to be not assertable.

From the example depicted in FIG. 3A and FIG. 3B, it should be realized that in designs with many thousands or million gates, possibly including many target and constraint gates, it becomes very cumbersome and difficult to ensure under the prior art that optimal results obtained from a retiming solver can be guaranteed to adhere to the specified constraints.

What is needed is a sound method to perform retiming in a verification setting under the presence of constraints.

SUMMARY OF THE INVENTION

A method, system and computer program product for performing retiming in the presence of constraints are disclosed. The method comprises receiving an initial design containing one or more targets and one or more constraints and enumerating the one or more constraints and the one or more targets into a retiming gate set. A retiming graph is constructed from the initial design, and a retiming solution is obtained on the retiming graph. The retiming solution is normalized. One or more retiming lags from the retiming graph are propagated to the initial design, and the initial design is verified by using a constraint-satisfying analysis to determine whether the one or more targets may be hit while the one or more constraints are satisfied.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention is the first invention to address the problem of retiming in the presence of constraints The present invention provides a retiming solution sufficient so that the retiming solution may be manipulated to ensure that it preserves verification semantics under constraints (e.g., the retiming solution ensures soundness and completeness; that proofs as well as falsifications are preserved). The present invention also provides a general method that may be used to obtain an optimal retiming, which in turn may be manipulated to ensure that it preserves verification semantics under constraints.

Figure 1:
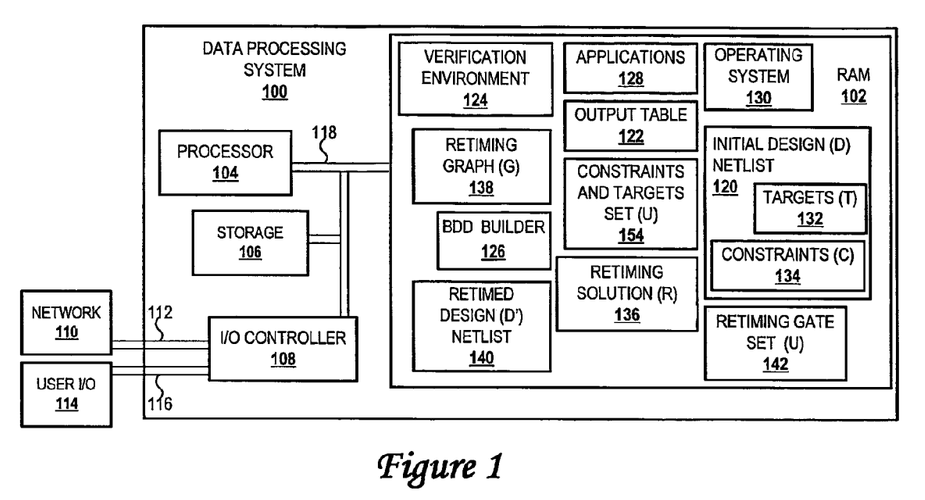
FIG. 1 depicts a block diagram of a general-purpose data processing system with which the present invention of a method, system and computer program product for performing retiming in the presence of constraints may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include an initial design (D) netlist 120 and an output table 122 for interaction with a verification environment 124. In the embodiment shown in FIG. 1, initial design (D) netlist 120 contains targets (T) 132 and constraints (C) 134. Other applications 128 and verification environment 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures in RAM 102 include retiming solution (R) 136, retiming graph 138, retiming gate set (U) 142 and retimed design (D') netlist 140.

A netlist graph, such as design netlist 120, is a popular means of compactly representing problems derived from circuit structures in computer-aided design of digital circuits. Such a representation is non-canonical and offers the ability to analyze the function from the nodes in the graph. A netlist, such as initial design (D) netlist 120, contains a directed graph with vertices representing gates and edges representing interconnections between those gates. The gates have associated functions, such as constants, primary inputs (e.g., RANDOM gates), combinational logic (e.g., AND gates), and sequential elements (hereafter referred to as registers). Registers have two associated components; their next-state functions and their initial-value functions, which are represented as other gates in the graph. Certain gates in the netlist may be labeled as "primary outputs", "targets", "constraints", etc.

Semantically, for a given register, the value appearing at its initial-value gate at time "0" ("initialization" or "reset" time) will be applied by verification environment 124 as the value of the register itself; the value appearing at its next-state function gate at time "i" will be applied to the register itself at time "i+1". Certain gates are labeled as targets (T) 132 and/or constraints (C) 134. Targets (T) 132 correlate to the properties that require verification. Constraints (C) 134 are used to artificially limit the stimulus that can be applied to the RANDOM gates of initial design (D) netlist 120; in particular, when searching for a way to drive a "1" to a target (T) 132, the verification environment 124 must adhere to rules such as, for purpose of example, that "every constraint gate must evaluate to a logical 1 for every time-step" or "every constraint gate must evaluate to a logical 1 for every time-step up to, and including, the time-step at which the target is asserted." For example, in verification environment 124, a constraint could be added which drives a 1 exactly when a vector of RANDOM gates to simulate even parity. Without its constraint, the verification environment 124 would consider valuations with even or off parity to those RANDOM gates; with the constraint, only even parity would be explored.

Processor 104 executes instructions from programs, often stored in RAM 102, in the course of performing the present invention. In a preferred embodiment of the present invention, processor 104 executes verification environment 124.

In a preferred embodiment, the present invention is applied to a netlist representation where the only combinational gate type is a 2-input AND, and inverters are represented implicitly as edge attributes. Registers have two associated components, their next-state functions, and their initial-value functions. Both are represented as other gates in design (D) netlist 120. Semantically, for a given register, the value appearing at its initial-value gate at time '0' ("initialization" or "reset" time) will be applied as the value of the register itself; the value appearing at its next-state function gate at time "i" will be applied to the register itself at time "i+1". Certain gates are labeled as "targets" and/or "constraints".

Targets 132 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the fail event getting triggered is generated and recorded to output table 122.

Verification environment 124 includes a computer program product, stored in RAM 102 and executed on processor 104, which provides a series of tools for activities such as equivalence checking, property checking, logic synthesis and false-paths analysis. Generally speaking, verification environment 124 contains rule-based instructions for predicting the behavior of logically modeled items of hardware.

Verification environment 124 uses the series of rules contained in its own instructions, in conjunction with design netlist 120, to represent the underlying logical problem structurally (as a circuit graph). In a preferred embodiment, verification environment 124 includes a Cycle-Based Symbolic Simulator (CBSS), which performs a cycle-by-cycle simulation on design netlist 120 symbolically by applying unique random, or non-deterministic, variables to the netlist inputs in every cycle.

Verification environment 124 extends the cycle simulation methodology to symbolic values. Verification environment 124 applies symbolic functions to the inputs in every cycle and propagates them to the targets 132. Hence, state-variables/next-state functions and the targets are expressed in terms of the symbolic values applied in the various cycles. If a target is hit, a counterexample may generated simply by assigning concrete values to the symbolic values in the cycles leading up to the failure.

In the present invention, retiming is used in a verification environment 124 in several steps. Initially, the verification problem is split into two sub-problems. First, as will be explained below with respect to steps 200–238 of FIG. 2 (described below) verification environment 124 checks, using time-bounded analysis that targets (T) 132 cannot be asserted in the first N time-steps, where "r(T)"=−N. If targets (T) 132 can be asserted in the first N time-steps, then verification environment 124 has solved the relevant verification problem by demonstrating how to assert the target. Otherwise, verification environment 124 solves a second problem in steps 244–258 of FIG. 2, by determining whether the representations of the retimed target gate may ever be asserted. Note that retiming may push registers fanout-wise beyond target nodes if verification environment 124 obtains a negative retiming value for a target (T) 132 gate. The registers which have been retimed fanout-wise past the target (T) 132 gate may likely fall out of the cone of influence of all the target (T) 132 gates and constraint (C) 134 gates for this sub-problem.

When verification environment 124 performs forward-retiming of a RANDOM gate, verification environment 124 introduces a new register into initial design (D) netlist 120, whose retimed initial value is defined to be a new, unique RANDOM gate. More generally, when verification environment 124 retimes a register beyond an arbitrary gate, verification environment 124 applies the function of that gate to the initial value of the retimed register. For example, forward-retiming a constant-zero gate renders a register with a constant-zero initial value. Forward retiming of a set of registers beyond an AND gate by verification environment 124 requires verification environment 124 to AND together the initial values of all those registers to apply as the initial value of the resulting retimed register. This process is referred to hereafter as "combinational unfolding", and is by verification environment 124 used to compute the retimed initial values.

Note also that verification environment 124 performs the operation of checking that the target cannot be asserted at times 0 . . . N−1 by checking that the retimed initial values of all registers forward-retimed beyond the target gate cannot be asserted.

In order for verification environment 124 to satisfy a requirement that retiming solution (R) 136 preserves verification semantics under constraints, all constraint gates and target gates are retimed by verification environment 124 by the same value. This condition ensures that verification environment 124 preserves overall verification semantics. Verification environment 124 models initial design (D) netlist 120 in retiming solution (R) 136 such that a generic algorithm may be used to obtain an optimal retiming, which in turn may be manipulated to ensure that it preserves verification semantics under constraints.

As discussed, optimal retiming by verification environment 124 often relies upon the use of specific algorithms. In particular, retiming may be cast as a min-cost flow problem for which verification environment 124 may use the "network simplex" algorithm, or an Integer Linear Program solver, to obtain an optimal solution. Use by verification environment 124 of such algorithms arises from the view of the retiming the problem as a graph. When modeling the retiming by verification environment 124 of a hardware design, gates are modeled as nodes in the graph, with interconnections represented as edges in that graph. The retiming algorithms used by verification environment 124 have no notion of semantics of the corresponding gates, targets, or constraints.

Instead of passing the target (T) 132 gates and constraint (C) 134 gates as distinct nodes to the retiming solver within verification environment 124, verification environment 124 re-labels them as being the same SINGLE node. Thus, it will appear to any retiming solver instructions within verification environment 124 that every target (T) 132 gate and constraint (C) 134 gate of initial design (D) netlist 120 is a single node in a graph, and every incoming edge to every target (T) 132 gate and constraint (C) 134 gate of initial design (D) netlist 120 is an incoming edge to the new SINGLE node. Similarly, every outgoing edge from every target (T) 132 gate and constraint (C) 134 gate of initial design (D) netlist 120 is an outgoing edge from the new SINGLE node. After obtaining a retiming solution (R) 136, verification environment 124 applies the retiming value from each node in retiming graph (G) 138 to the corresponding gates in initial design (D) netlist 120. For non-target and non-constraint nodes, this mapping is 1:1; for target and constraint nodes, verification environment 124 maps the retiming value of the SINGLE node to each target (T) 132 gate and constraint (C) 134 gate.

Figure 4A:
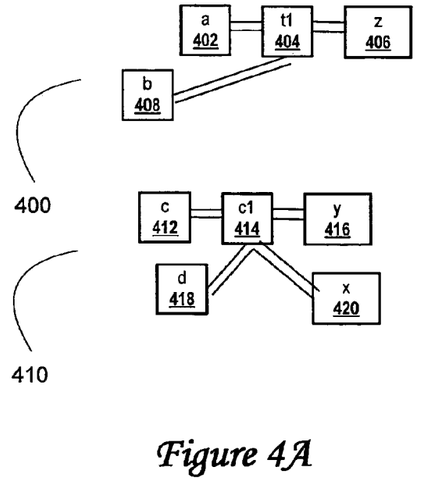
FIG. 4A illustrates an exemplary set of target and constraint gates.

Referring now to FIG. 4A, an exemplary set of target and constraint gates is depicted. Within target group 400, t1 404 is a target gate, and, within constraint group 410, c1 414 is a constraint gate. As depicted, t1 404 has incoming edges from gates a 402 and b 408, and c1 414 has incoming edges from gates c 412 and d 418. Similarly, t1 404 has an outgoing edge to gate z 406, and c1 414 has outgoing edges to gates x 420 and y 416.

Figure 4B:
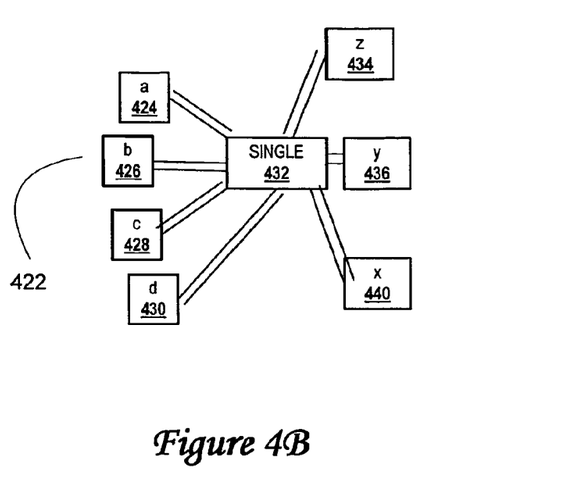
FIG. 4B illustrates an exemplary retimed set of target and constraint gates in accordance with a preferred embodiment of the present invention.

Turning now FIG. 4B an exemplary retimed set of target and constraint gates in accordance with a preferred embodiment of the present invention is illustrated. After remodeling target group 400 and constraint group 410, verification environment 124 a single gate group 422, in which the new node SINGLE 432 is used in place of t1 404 and c1 414. SINGLE 432 has incoming edges from nodes a 424, b 426, c 428, and d 430, and outgoing edges to nodes x 440, y 436, and z 434.

After the verification environment 124 obtains an optimal solution on the design of single gate group 422, verification environment 124 applies the retiming values for nodes a 424, b 426, c 428, d 430, x 440, y 436, and z 434 in single gate group 422 to the corresponding gates in target group 400 and constraint group 410. Additionally, verification environment 124 applies the retiming values for node SINGLE 432 to both gates t1 404 and c1 414 in target group 400 and constraint group 410.

This re-labeling forces verification environment 124 to produce an identical retiming for each target (T) 132 gate and constraint (C) 134 gate. Rather than attempting to force such a criteria externally from the verification environment 124 (e.g., as a post-processing step over the obtained solution), which may well render a suboptimal result, verification environment 124 merely alters the modeling given to used on target (T) 132 gates and constraint (C) 134 gates, allowing verification environment 124 to produce an optimal solution.

Additionally, constraint semantics are preserved. Verification environment 124 checks, using time-bounded analysis that the target "t" cannot be asserted in the first N time-steps (i.e., at time 0 . . . N−1, where r(t)=N). Note that the present invention guarantees that every target and constraint gate "t" has the same "r(t)" value. When performing this check, verification environment 124 merely enforces that every constraint (C) 134 in initial design (D) netlist 120 be used to perform this bounded check. The following pseudo-code illustrates the structures that may be included within verification environment 124 to perform the verification function:

```
for(i=0;iN;i++) {
    unfold target "t" for time "i"
    unfold each constraint gate "c" for time 0..i
    check if "t" can be asserted to1 at time "i" while
    satisfying all constraint gates at time 0..i
    // this is a satisfiability check of the conjunction
    of each unfolding from the above steps
    if such an assertion is possible, report counterexample trace and BREAK
}
if (i = = N) { // we did not find a counterexample from above
    // target is not hittable at time 0..N, proceed to second sub-problem
}
```

After performing steps using code modeled on the pseudocode above, verification environment 124 passes the retimed target (T) 132 gates and constraint (C) 134 gates to a subsequent verification process within verification environment 124. Effectively, this subsequent verification process within verification environment 124 checks whether targets (T) 132 may be asserted while satisfying constraints at times N, N+1, . . . with respect to the original problem proposed in initial design (D) netlist 120. However, the constraints (C) 134 also impose restrictions on RANDOM gate evaluations at times 0 . . . N−1. Such constraints (C) 134 may impact the initial values of the retimed design (D') netlist 140. Neglecting the values of constraints (C) 134 that have been effectively retimed away from retimed design (D') netlist 140 may still be prone to generating assertions of the retimed targets (T) 132, which violate the original constraints (C) 134.

Verification environment 124 therefore enforces the values of constraints (C) 134 in the earlier time-steps by including the combinationally unfolded versions of those constraint (C) 134 gates for times 0 . . . N−1 as constraints (C) 134. This in turn will impose the necessary constraints (C) 134 on the combinationally unfolded retimed initial values. Coupled with passing the retimed constraint (C) 134 gates, which all have the same retiming value (which additionally have the same value as the target (T) 136 gates), this behavior of the present invention ensures that verification semantics will be preserved.

Overall, the mechanisms described above allow verification environment 124 to provide optimal retiming under the presence of constraints in a verification toolset which includes a retiming engine.

Figure 2:
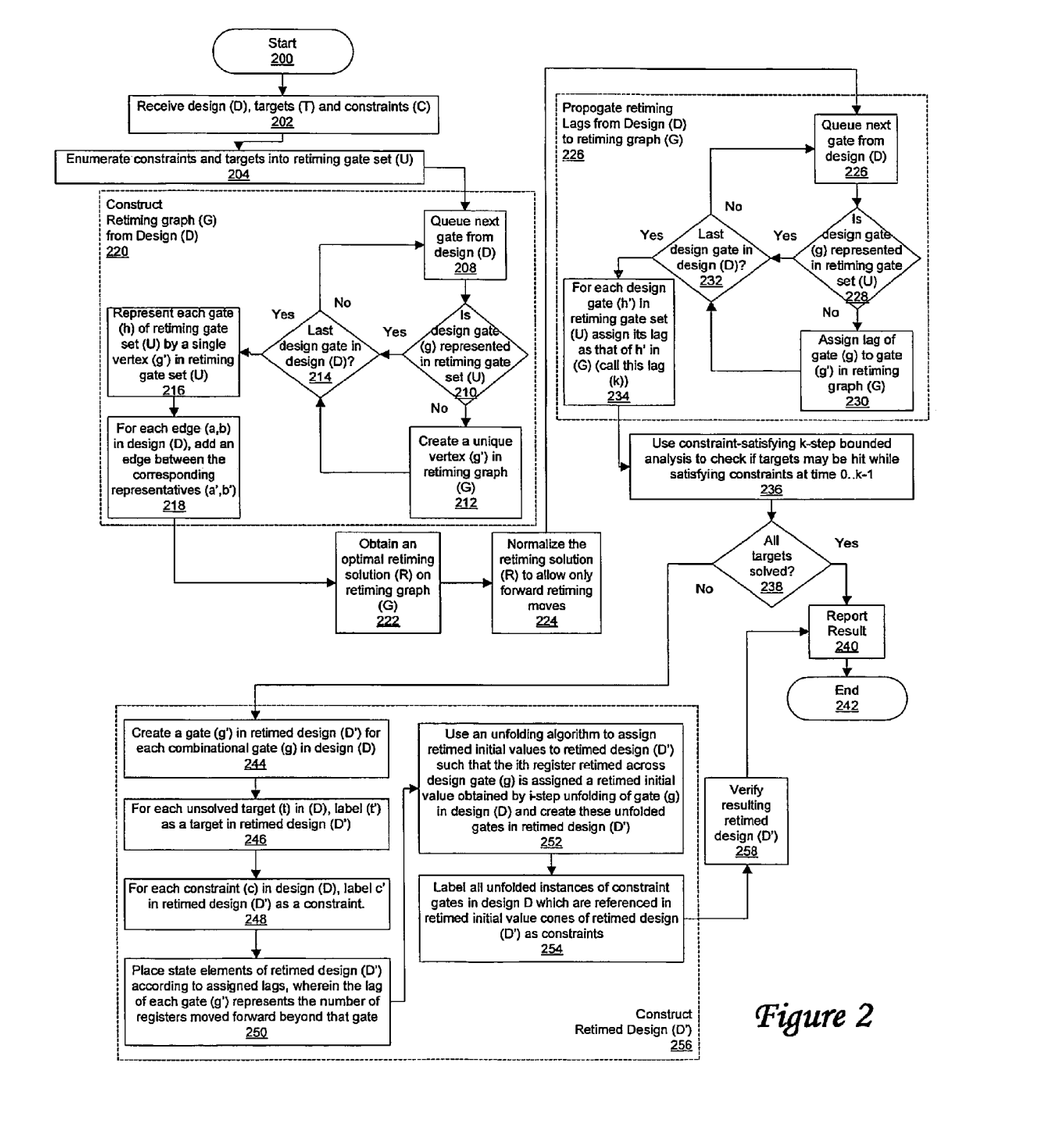
FIG. 2 is a high-level logical flowchart of a process for performing retiming in the presence of constraints.

The use of the processes described above in the form of an integrated verification environment 124 is described below. Turning now to FIG. 2, a high-level logical flowchart of a process for performing re-timing of designs in the presence of constraints is depicted. The process starts at step 200. The process next proceeds to step 202, which depicts verification environment 124 receiving initial design (D) netlist 120 containing targets (T) 132 and constraints (C) 134. The process then moves to step 204. At step 204, verification environment 124 enumerates targets (T) 132 and constraints (C) 134 from initial design (D) netlist 120 into retiming gate set (U) 142. The process then proceeds to step 208.

Steps 226–234, illustrate a logical sub-process, labeled as macro-step 220. Macro-step 220 depicts verification environment 124 constructing retiming graph (G) 138 from initial design (D) netlist 120. At step 208, verification environment 124 queues a next gate from initial design (D) netlist 120. The process next moves to step 210, which illustrates verification environment 124 determining whether the design gate queued in step 208 is represented in retiming gate set (U) 142. If the design gate queued in step 208 is not represented in retiming gate set (U) 142, then the process passes to step 212. Step 212 depicts verification environment 124 creating a unique vertex (g') in retiming graph (G) 138. The process then moves to step 214, which is described below. Returning to step 210, if the design gate queued in step 208 is represented in retiming gate set (U) 142, then the process passes to step 214.

Step 214 illustrates verification environment 124 determining whether the gate queued in step 208 is the last design gate in initial design (D) netlist 120. If the gate queued in step 208 is not the last design gate in initial design (D) netlist 120, then the process returns to step 208, which is described above. If, at step 214, verification environment 124 determines that the gate queued in step 208 is the last design gate in initial design (D) netlist 120 then the process proceeds to step 216, which depicts verification environment 124 representing each gate (h) of retiming gate set (U) by a single vertex (g') in retiming graph (G) 138. The process then moves to step 218. Step 218 illustrates, for each edge (a, b) initial design (D) netlist 120, verification environment 124 adding an edge between corresponding representatives (a', b').

The process then proceeds to step 222, which depicts verification environment 124 obtaining an optimal retiming solution (R) 136 on retiming graph (G) 138. The process next moves to step 224. At step 224, verification environment 124 normalizes retiming solution (R) 136 to allow only forward retiming moves. The process then proceeds to step 226.

Steps 226–234, represent a logical sub-process, labeled as macro-step 227. In step 227, verification environment 124 propagates retiming lags from initial design (D) netlist 120 to retiming graph (G) 138. At step 226, verification environment 124 queues a next gate from initial design (D) netlist 120. The process next proceeds to step 228, which depicts verification environment 124 determining whether the design gate (g) queued in step 226 is represented in retiming gate set (U). If the design gate (g) selected in queued in step 226 is not represented in retiming gate set (U), then the process next proceeds to step 230, which depicts verification environment 124 assigning the lag of gate (g) to gate (g') in retiming graph (G) 138. The process then proceeds to step 232, which is described below.

Returning to step 228, if verification environment 124 determines that the design gate selected in step 226 is not represented in retiming gate set 142, then the process moves to step 232, which depicts verification environment 124 determining whether the design gate queued in step 226 is the last design gate in initial design (D) netlist 120. If verification environment 124 determines that the gate queued in step 226 is not the last design gate in initial design (D) netlist 120, then the process returns to step 226. If verification environment 124 determines that the gate queued in step 226 is the last design gate in initial design (D) netlist 120, then the process progresses to step 234.

At step 234, for each design gate (h') in retiming gate set (U) 142, verification environment 124 assigns the gate's lag as that of (h') in retiming graph (G) 138. This lag is referred to as (k). The process next moves to step 236, which illustrates verification environment 124 using constraint satisfying k-step bounded analysis using constraint satisfying k-step bounded analysis to check if targets may be hit while satisfying constraints at any time from time zero to time k−1. The process then moves to step 238.

At step 238, verification environment 124 determines if all targets 132 in initial design (D) netlist 120 have been solved. If verification environment 124 determines that all targets (T) 132 in initial design (D) netlist 120 have been solved, then the process moves to step 240, which depicts verification environment 124, reporting the result to output table 122. The process then ends at step 242. Returning to step 238, if verification environment 124 determines that not all targets (T) 132 and initial design (D) netlist 120 have been solved, then the process proceeds to step 244.

Steps 244 thru 254 are sub-steps of a larger process for verification environment 124 to construct a retimed design (D') netlist 140. These steps are labeled as macro-step 256. At step 244, verification environment 124 creates a gate (g') in retimed design (D') netlist 140 for each combinational gate (g) in initial design (D) netlist 120. The process then proceeds to step 246 which depicts, for each unsolved target (t) 132 in initial design (D) netlist 120, verification environment 124 labeling (t') as a target in retimed design (D') netlist 140. The process next moves to step 248. At step 248, for each constraint (c) 134 in initial design (D) netlist 120, verification environment 124 labels (c') and retimed design (D') netlist 140 as a constraint.

The process then proceeds to step 250, which illustrates verification environment 124 placing state elements of retimed design (D') netlist 140, according to assigned lags, wherein the lag of each gate (G') represents the number of registers moved forward beyond that gate. The process then moves to step 252. At step 252, verification environment 124 uses an unfolding algorithm to assign retimed initial values to retimed design (D') netlist 140, such that the ith register retimed across design gate (g) is assigned a retimed initial value obtained by i-step unfolding of gate (g) in initial design (D) netlist 120, and verification environment creates these unfolded gates in retimed design (D') netlist 140. The process then proceeds to step 254, which depicts verification environment 124 labeling all unfolded instances of constraint (c) 134 gates in initial design (D) netlist 120 which are referenced in retimed initial value cones of retimed design (D) netlist 140 as constraints.

The process then proceeds to step 258, which illustrates verification environment 124 verifying the resulting retimed design (D') netlist 140. The process then returns to step 240, which is described above.

The present invention provides a method to perform retiming in a verification setting under the presence of constraints. The present invention includes a method to model a retiming formulation to enable optimal retiming in the presence of constraints, and to ensure that the resulting solution may be used in a fashion that preserves constraint semantics. In the present invention resulting retiming solution is used in a verification setting to ensure that the constraints retain their semantics upon the verification problem.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method for performing verification, said method comprising:
   receiving an initial design containing one or more targets and one or more constraints;
   enumerating said one or more constraints and said one or more targets into a retiming gate set;
   constructing a retiming graph from said initial design;
   obtaining a retiming solution on said retiming graph;
   normalizing said retiming solution;
   propagating one or more retiming lags from said retiming graph to said initial design to create a propagated design; and
   verifying said propagated design by using a constraint-satisfying analysis to determine whether said one or more targets may be hit while said one or more constraints are satisfied.

2. The method of claim 1, further comprising, responsive to determining that said one or more targets may not be hit while said one or more constraints are satisfied, constructing a retimed design; and verifying said retimed design.

3. The method of claim 2, wherein said step of constructing a retiming graph from said initial design further comprises:
   for each of one or more selected design gates not in said retiming gate set, creating a unique vertex in said retiming graph;
   representing each of said one or more selected design gates in said retiming gate set with a single vertex in said retiming graph; and
   for each of one or more selected edges in said initial design, adding an edge in said retiming graph.

4. The method of claim 1, wherein said step of obtaining a retiming solution on said retiming graph further comprises obtaining an optimal retiming solution on said retiming graph.

5. The method of claim 1, wherein said step of normalizing said retiming solution further comprises normalizing said retiming solution to exclusively allow one or more forward retiming moves.

6. The method of claim 1, wherein said step of propagating one or more retiming lags from said retiming graph to said initial design to create a propagated design further comprises, for each gate in said retiming gate set, assigning to said gate a lag of a corresponding gate in said retiming graph.

7. The method of claim 1, wherein said step of propagating one or more retiming lags from said retiming graph to said initial design to create a propagated design further comprises, for each gate not in said retiming gate set, assigning to said gate a lag of a corresponding gate in said retiming graph.

8. The method of claim 1, wherein said step of constructing a retimed design further comprises:
   creating a retimed gate in said retimed design for each of one or more selected combinational gates in said initial design;
   for each of one or more selected unsolved targets among said one more targets in said initial design, labeling a retimed unsolved target in said retimed design;
   for each of said one or more constraints in said initial design, labeling a retimed constraint in said retimed design;
   placing one or more state elements in said retimed design according to one or more corresponding assigned lags, wherein a corresponding assigned lag represents a number of registers moved forward beyond said gate;
   using an unfolding algorithm to assign one or more retimed initial values to said retimed design, such that an ith register retimed across said gate is assigned a retimed initial value obtained by i-step unfolding of said gate in said initial design;
   creating unfolded gates in said retimed design; and
   labeling one or more unfolded instances of constraint gates in said initial design which are referenced in one or more retimed initial value cones of said retimed design as said constraints.

9. A system for performing verification, said system comprising:
   means for receiving an initial design containing one or more targets and one or more constraints;
   means for enumerating said one or more constraints and said one or more targets into a retiming gate set;
   means for constructing a retiming graph from said initial design;
   means for obtaining a retiming solution on said retiming graph;
   means for normalizing said retiming solution;
   means for propagating one or more retiming lags from said retiming graph to said initial design to create a propagated design; and
   means for verifying said propagated design by using a constraint-satisfying analysis to determine whether said one or more targets may be hit while said one or more constraints are satisfied.

10. The system of claim 9, further comprising, means, responsive to determining that said one or more targets may not be hit while said one or more constraints are satisfied, for constructing a retimed design; and verifying said retimed design.

11. The system of claim 10, wherein said means for constructing a retiming graph from said initial design further comprises:
   means, for each of one or more selected design gates not in said retiming gate set, for creating a unique vertex in said retiming graph;
   means for representing each of said one or more selected design gates in said retiming gate set with a single vertex in said retiming graph; and
   means, for each of one or more selected edges in said initial design, for adding an edge in said retiming graph.

12. The system of claim 9, wherein said means for constructing a retimed design further comprises:
   means for creating a retimed gate in said retimed design for each of one or more selected combinational gates in said initial design;
   means, for each of one or more selected unsolved targets among said one more targets in said initial design, for labeling a retimed unsolved target in said retimed design;
   means, for each of said one or more constraints in said initial design, for labeling a retimed constraint in said retimed design;
   means for placing one or more state elements in said retimed design according to one or more corresponding assigned lags, wherein a corresponding assigned lag represents a number of registers moved forward beyond said gate;
   means for using an unfolding algorithm to assign one or more retimed initial values to said retimed design, such that an ith register retimed across said gate is assigned a retimed initial value obtained by i-step unfolding of said gate in said initial design;

means for creating unfolded gates in said retimed design; and means for labeling one or more unfolded instances of constraint gates in said initial design which are referenced in one or more retimed initial value cones of said retimed design as said constraints.

13. A computer program product in a computer-readable medium for performing verification, said computer program product comprising:

a computer-readable medium;

instructions on the computer-readable medium for receiving an initial design containing one or more targets and one or more constraints;

instructions on the computer-readable medium for enumerating said one or more constraints and said one or more targets into a retiming gate set;

instructions on the computer-readable medium for constructing a retiming graph from said initial design;

instructions on the computer-readable medium for obtaining a retiming solution on said retiming graph;

instructions on the computer-readable medium for normalizing said retiming solution;

instructions on the computer-readable medium for propagating one or more retiming lags from said retiming graph to said initial design to create a propagated design; and instructions on the computer-readable medium for verifying said initial design by using a constraint-satisfying analysis to determine whether said one or more targets may be hit while said one or more constraints are satisfied.

14. The computer program product of claim 13, further comprising instructions, responsive to determining that said one or more targets may not be hit while said one or more constraints are satisfied, for constructing a retimed design; and verifying said retimed design.

15. The computer program product of claim 14, wherein said instructions for constructing a retiming graph from said initial design further comprises:

instructions, for each of one or more selected design gates not in said retiming gate set, for creating a unique vertex in said retiming graph;

instructions on the computer-readable medium for representing each of said one or more selected design gates in said retiming gate set with a single vertex in said retiming graph; and instructions, for each of one or more selected edges in said initial design, for adding an edge in said retiming graph.

16. The computer program product of claim 13, wherein said instructions for obtaining a retiming solution on said retiming graph further comprises instructions on the computer-readable medium for obtaining an optimal retiming solution on said retiming graph.

17. The computer program product of claim 13, wherein said instructions for normalizing said retiming solution further comprises instructions on the computer-readable medium for normalizing said retiming solution to exclusively allow one or more forward retiming moves.

18. The computer program product of claim 13, wherein said instructions on the computer-readable medium for propagating one or more retiming lags from said retiming graph to said initial design to create a propagated design further comprises instructions, for each gate in said retiming gate set, assigning to said gate a lag of a corresponding gate in said retiming graph.

19. The computer program product of claim 13, wherein said instructions on the computer-readable medium for propagating one or more retiming lags from said retiming graph to said initial design further to create a propagated design comprises instructions, for each gate not in said retiming gate set, assigning to said gate a lag of a corresponding gate in said retiming graph.

20. The computer program product of claim 13, wherein said instructions for constructing a retimed design further comprises:

instructions on the computer-readable medium for creating a retimed gate in said retimed design for each of one or more selected combinational gates in said initial design;

instructions, for each of one or more selected unsolved targets among said one more targets in said initial design, labeling a retimed unsolved target in said retimed design;

instructions, for each of said one or more constraints in said initial design, labeling a retimed constraint in said retimed design;

instructions on the computer-readable medium for placing one or more state elements in said retimed design according to one or more corresponding assigned lags, wherein a corresponding assigned lag represents a number of registers moved forward beyond said gate;

instructions on the computer-readable medium for using an unfolding algorithm to assign one or more retimed initial values to said retimed design, such that an ith register retimed across said gate is assigned a retimed initial value obtained by i-step unfolding of said gate in said initial design;

instructions on the computer-readable medium for creating unfolded gates in said retimed design; and instructions on the computer-readable medium for labeling one or more unfolded instances of constraint gates in said initial design which are referenced in one or more retimed initial value cones of said retimed design as said constraints.

* * * * *